United States Patent [19]

Macovski et al.

[11] Patent Number: 4,993,414
[45] Date of Patent: Feb. 19, 1991

[54] MOVING MATERIAL PROJECTION IMAGING SYSTEM USING NUCELAR MAGNETIC RESONANCE

[75] Inventors: Albert Macovski, Menlo Park; Dwight G. Nishimura, Palo Alto, both of Calif.

[73] Assignee: The Board of Trustees of the Leland Stanford Junior University, Stanford, Calif.

[21] Appl. No.: 401,491

[22] Filed: Aug. 28, 1989

Related U.S. Application Data

[63] Continuation of Ser. No. 195,490, May 17, 1988, abandoned, which is a continuation of Ser. No. 766,752, Aug. 16, 1985, abandoned.

[51] Int. Cl.$^5$ .............................................. A61B 5/055
[52] U.S. Cl. ............................. 128/653 AF; 324/306; 324/309
[58] Field of Search ..................... 128/653 AF, 653 A; 324/306, 309, 312, 307

[56] References Cited

U.S. PATENT DOCUMENTS

| | | | |
|---|---|---|---|
| 4,254,778 | 3/1981 | Clow et al. | 128/653 |
| 4,516,075 | 5/1985 | Moran | 324/309 |
| 4,516,582 | 5/1985 | Redington | 128/653 |
| 4,532,473 | 7/1985 | Wehrli | 324/306 |
| 4,553,096 | 11/1985 | Randell | 324/309 |
| 4,564,813 | 1/1986 | Young et al. | 324/309 X |
| 4,574,239 | 3/1986 | Singer | 128/653 |
| 4,602,641 | 7/1986 | Feinberg | 128/653 |
| 4,654,591 | 3/1987 | Moran | 324/306 |

Primary Examiner—Ruth S. Smith
Attorney, Agent, or Firm—Henry K. Woodward

[57] ABSTRACT

A two-dimensional projection image of the NMR activity within a volume is obtained. The signals due to static material are not excited and do not appear in the projection image. The signals due to moving blood in vessels produce an isolated image of the vessels with the superimposed structure removed. Excitation systems are used which excite only moving material and return static material to equilibrium.

11 Claims, 5 Drawing Sheets

MOVING MATERIAL PROJECTION IMAGING SYSTEM USING NUCELAR MAGNETIC RESONANCE

This is a continuation of application Ser. No. 195,490 filed May 17, 1988 now abandoned, which is a continuation of Ser. No. 766,752 filed 8/16/85 now abandoned.

BACKGROUND OF THE INVENTION

1. Field of the Invention

This invention relates to medical imaging systems using nuclear magnetic resonance. In a primary application the invention relates to projection imaging of blood vessels by virtue of the moving blood within the vessels. Other applications include general projection imaging of moving materials.

2. Description of Prior Art

Nuclear magnetic resonance, abbreviated NMR, represents a new approach to medical imaging. It is completely non-invasive and does not involve ionizing radiation. In very general terms, magnetic moments are excited at specific spin frequencies which are proportional to the local magnetic field. The radio frequency signals resulting from the decay of these spins are received using pick-up coils. By manipulating the magnetic fields, an array of signals are provided representing different regions of the volume. These are combined to produce a volumetric image of the density of the body.

A descriptive series of papers on NMR appeared in the June 1980 issue of the *IEEE Transactions on Nuclear Science*, Vol. NS-27, pp. 1220–1255. The basic concepts are described in the lead article, "Introduction to the Principles of NMR" by W. V. House, pp. 1220–1226.

A number of three-dimensional methods are described. One important one is described by P. V. Lauterbur and C. M. Lou entitled, "Zeugmatography by Reconstruction from Projections," pp. 1227–1231. In this approach, a linear field gradient is superimposed on the strong axial magnetic field. As a result of the gradient, each plane in the volume, in a direction normal to the gradient, experiences a different resonant frequency. A burst, containing a spectrum of frequencies, is used to simultaneously excite each of the planes. The received signal, following the excitation, is then Fourier transformed into its individual components. The amplitude at each frequency represents a planar integration of the proton density. This process can be repeated using a gradient field in different directions to collect information about arrays of planes. These planar integrals can be used to produce two-dimensional projection images of a volume or, alternatively, three-dimensional information about the proton density of each voxel in the volume.

The projection image is obtained by obtaining the integrated density of substantially all planes which are normal to the plane of the projection image. The total number of planes required, at all angles and positions, is substantially equal to the number of pixels in the two-dimensional projection image. The reconstruction procedure involves the classical reconstruction from projections widely used in current computerized tomography systems. The most generally used procedure is that of convolution-back projection.

The resultant two-dimensional projection images have a number of drawbacks as regards the imaging of vessels. Firstly, the superimposed intervening structures make it very difficult to visualize the vessels and diagnose stenosis or narrowing. Secondly, the nature of this imaging procedure is such that all of the measurements affect every reconstructed pixel. This makes the image particularly sensitive to motion. Any motion of the object will cause artifacts in the image due to inconsistencies where the object does not match its projections. These artifacts can often obscure the desired information.

To avoid the problems of intervening structures, three-dimensional reconstructions are made which provides cross-sectional images. The approach taken in the Lauterbur paper involves making an array of two-dimensional projection images at every angle through the object. Lines in these projection images represent line integrals or projections of cross-sectional planes of the object. Thus, again using classical reconstruction techniques, any desired cross-sectional plane can be reconstructed. The intermediate two-dimensional projections are not used for the reasons discussed.

Although these cross-sectional images are free of intervening structures, they are unsuitable for vessel imaging. Vessel imaging, no matter what the modality, x-ray or NMR, is best done with two-dimensional projection images. Cross-sections merely show slices through the vessels. In addition, the acquisition of three-dimensional data takes a relatively long time, thus resulting in a variety of artifacts due to the various physiological motions of the body.

A second general method of acquiring and processing NMR imaging data is described in a paper by E. R. Andrew entitled "Nuclear Magnetic Resonance Imaging: The Multiple Sensitive Point Method" pp. 1232 to 1238 of the same issue. In this method, a selective system is used which acquires data from individual voxels in the volume of interest. This is accomplished using dynamically varying fields for the gradients. In general, with these dynamic fields, all but the small region not containing the time-varying field integrates to zero. Thus, if time varying fields of different frequencies are applied to three orthogonal axes, only a single point or voxel will not be time-varying. The signal will therefore represent solely that point without requiring reconstruction from projections.

The difficulty with this system is that it requires a very long data acquisition time since the signal is taken from one voxel at a time. Sufficient time must be spent at each voxel to provide an adequate signal to noise ratio. This problem is alleviated by using dynamic gradients on two axes and a static gradient on the third axis. Thus, in the direction of the third axis, each position again corresponds to a different frequency. Using wideband excitation and Fourier transforming the received signal the frequency spectra simultaneously provide the density of an array of voxels along a line. The line is that corresponding to the intersection of the two orthogonal dynamic gradients where all but a single line averages to zero.

Although this method avoids the motion artifacts caused by reconstruction from projections, it continues to provide a relatively long data acquisition time with the resulting blurring from physiological motions including respiratory and cardiovascular. In addition it is a three-dimensional imaging system which, as has been described, is generally unsuitable for vessel imaging.

A third imaging method is also line or point selective and is described in a paper by L. E. Crooks entitled, "Selective Irradiation Line Scan Techniques for NMR Imaging" of pp. 1239–1244 of the same issue. This general approach has a number of variations. In one, a selective pulse is used to excite a single plane of interest using a static gradient and an appropriately shaped pulse. The resulting signal from the excited plane is stored. Following equilibrium an orthogonal plane is excited with a higher intensity such that the magnetization is inverted or made negative. Irradiation of this type produces no received signal. The first step is then repeated by selectively exciting the plane of interest and storing the resultant signal. In this case, however, a line in the plane of interest will be missing since it has been saturated by the high intensity excitation of a plane orthogonal to the plane of interest. Thus the line of intersection is not included in the resultant signal. A simple subtraction of the first and second stored signals represents the line of intersection. By measuring different lines at many angles and positions in the plane of interest, using this subtraction procedure, a reconstructed image of the plane is made using classical reconstruction from projection techniques.

An alternative approach using the same line intersection of orthogonal planes avoids the subtraction operation. In this case the orthogonal plane is immediately excited with inverting radiation. The line of intersection is affected so as to produce a spin echo signal at a later time. Thus, at this later time, the signal represents the desired line only. Again, an array of line integral signals are used to provide a cross-sectional image.

Similar sensitive point and sensitive line methods have been suggested which results in saturation of all but a specific plane of interest. This is immediately followed by a similar excitation in an orthogonal direction which saturates everything in the plane except a line. Either the line integral signal can be acquired, or a third orthogonal excitation can be used to acquire the signal from a point or voxel. Saturation is achieved by a relatively long "burn" radio frequency pulse, in the presence of a gradient, which demagnetizes the region corresponding to the frequencies excited. This procedure is described in a paper by A. N. Garroway, P. K. Grannell and P. Mansfield, "Image Formation in NMR by a Selective Irradiative Process," which appeared in *J. Phys. C: Solid State Physics*, Vol. 7, 1974, pp. L457–L462.

An additional approach to NMR imaging is described in a recent book entitled *Nuclear Magnetic Resonance Imaging In Medicine*, published in 1981 by Igaku-Shoin, Ltd., Tokyo. Chapter 3 of this book, by Lawrence E. Crooks, provides an overview of the various imaging techniques. In addition to those already mentioned there is another planar integration approach described on pp. 44–47. Here, each plane integral is phase encoded by applying a gradient normal to the plane. When the gradient is removed, the nuclei along the plane have cyclical phase distributions, depending on the strength of the magnetic field. By acquiring these planar integrals using phase distributions with different spatial frequencies, information is acquired about each line in the plane. This information is decoded again using Fourier transforms. This approach has been termed spin warp imaging.

Another approach has recently been reported on, which also provides cyclical distributions along a plane. In this case, however, the cyclical variations are achieved by imposing a gradient on the intensity of the r.f. excitation field. If the gradient is made strong enough, cyclical variations will occur across the plane where the regions of 90° excitation will provide a maximum response and those of 0° and 180° will have no response. As before, a series of excitations with gradients of varying intensities provides cyclical variations at different spatial frequencies which can be transformed to reconstruct the distribution within the selected plane. This process is described in a paper by D. I. Hoult entitled, "Rotating Frame Zeugmatography," which appeared in *Phil. Trans. R. Soc. London*, B289:543–547 (1980).

All of the NMR imaging systems that have been reported on are unsuitable for vessel imaging for a number of previously indicated reasons. Firstly, all but the first technique have been used to provide three-dimensional cross-sectional images which are unsuitable for vessel imaging. The vessel will wind through many planes, such that each cross section is of limited value. Projection imaging, as presently practiced in x-ray angiography, has been clearly shown to be the preferred modality for diagnosing narrowing or stenosis in vessels. In the one case where projection NMR imaging has been considered, as in the system of the first paper cited, the intervening tissue would seriously reduce the effectiveness of the image. In addition, these images require very long data acquisition times and produce severe artifacts due to object motion.

A paper on flow measurement written by J. R. Singer entitled, "Blood Flow Measurements by NMR of the Intact Body," appeared on pp. 1245–1249 of the previously mentioned *IEEE Transactions on Nuclear Science*. In this paper the concept of phase shift of the spin echo being proportional to average velocity is presented. Singer proposes to use both phase sensitive and envelope detection to map the proton density and flow of an entire volume using three-dimensional imaging techniques. The resultant cross-sectional images would show both density and flow. As before, the principle difficulty with these images are the very long data acquisition time, with its associated distortions, and the relative inability to diagnose vessel disease with cross-sectional images.

An additional imaging sequence, described in a paper by I. R. Young, et al., entitled "Magnetic Resonance Properties of Hydrogen: Imaging the Posterior Fossa," *Amer. Journal of Radiology*, Vol. 137, pp. 895–901, Nov. 1981, and used in many of the present commercial instruments for cross-sectional imaging, involves a single excitation burst to select the desired plane. This burst takes place in the presence of a gradient in the z direction. Thus the burst frequency selects a specific xy plane in the volume. Immediately following the burst, when the FID signal is being received, the z gradient is turned off and a transverse gradient is applied. This results in each line in the plane, normal to the transverse gradient, generating a different frequency. For cross-sectional imaging this sequence is repeated with the transverse gradient rotated to different angles. For projection imaging, the subject of this application, only a single excitation in the presence of a transverse gradient is required to obtain the projection of the particular excited plane.

U.S. Pat. No. 4,523,596 by applicant, covered the basic concept and methods for producing a two-dimensional projection image of the moving material in a volume. This is a highly desirable modality for imaging blood vessels. The application showed a number of methods for imaging solely the moving material and cancelling the static material. These included a 180° inversion signal, a two-burst inversion signal, the subtraction of signals acquired at different times representing different velocities, the receiving of signals adjacent to the region being excited and the use of the phase shift resulting from moving nuclei.

This patent also described a variety of methods of providing a projection image. One of these involved the excitation of a plane, and then the decomposition of the plane into the required array of line integrals.

U.S. application Ser. No. 466,969 by applicant, now U.S. Pat. No. 4,565,968, represents further improvements in the imaging of moving blood in vessels. This included more effective excitation systems, methods of distinguishing the direction of blood vessels and imaging selected portions of the projected volume.

SUMMARY OF THE INVENTION

An object of this invention is to provide an NMR projection image of vessels within the body.

A further object of this invention is to provide an NMR projection image of vessels very rapidly to avoid motion artifacts.

A further object of this invention is to create an accurate vessel image independent of inhomogeneity of the NMR excitation system.

Briefly, in accordance with the invention, an excitation system is used which returns the magnetic moments of all static material to equilibrium so that static material produces no net signal and signals are generated solely by moving material. The volume of interest can be immediately re-excited without waiting for the system to relax. When using a symmetrical excitation the resultant image is relatively insensitive to inhomogeneity of the r.f. excitation. A projection image of vessels is created either one line at a time, or the entire image with a single excitation.

BRIEF DESCRIPTION OF THE DRAWINGS

For a more complete disclosure of the invention, reference may be made to the following detailed description of several illustrative embodiments thereof which is given in conjunction with the accompanying drawings, of which.

DESCRIPTION OF THE PREFERRED EMBODIMENT

Figure 1:
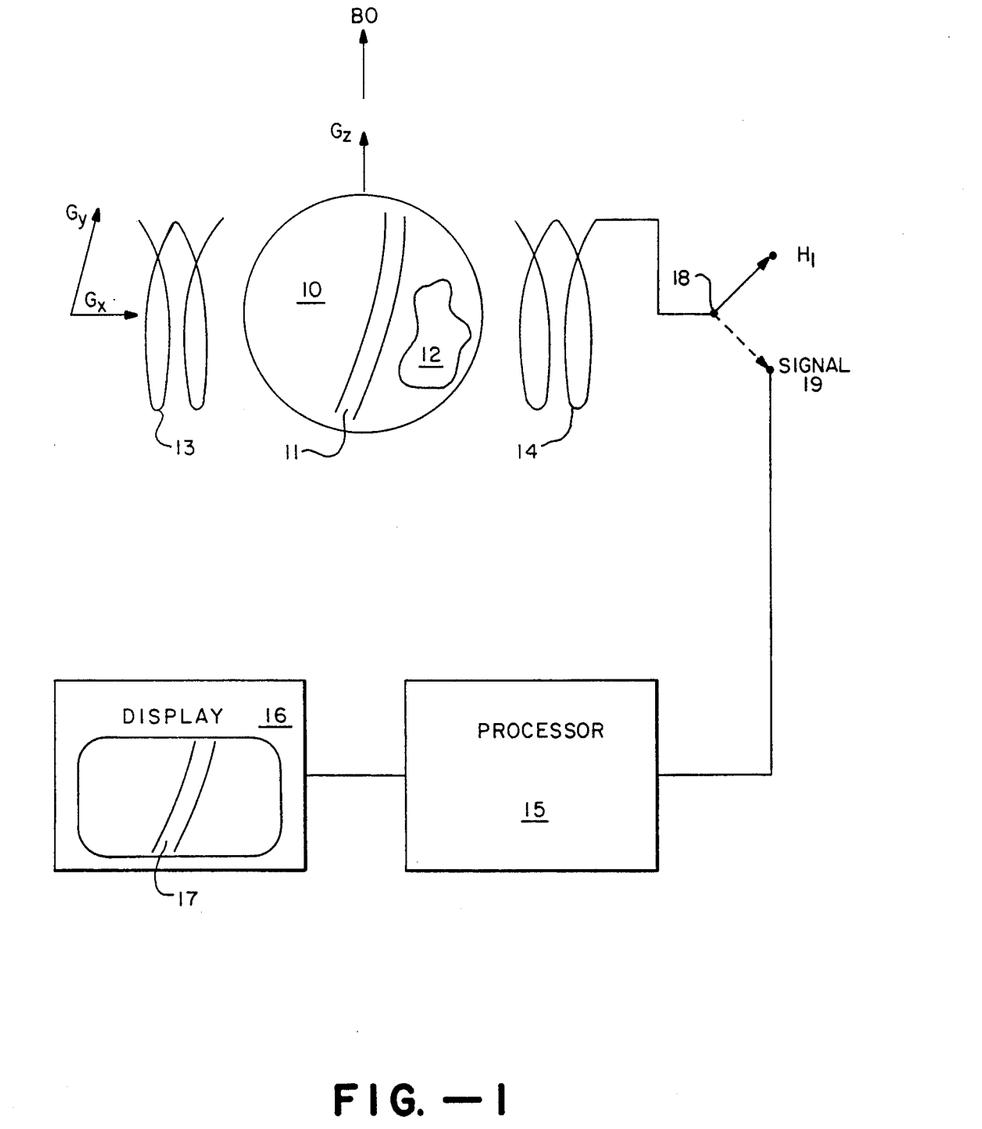
FIG. 1 is a schematic drawing illustrating an embodiment of the invention.

An understanding of the broad aspects of the invention may best be had by reference to FIG. 1. Here it is desired to provide an image of blood vessel 11 in a volume 10 of the human anatomy. Since the cross-sectional format is of little value in screening for vessel disease, projection images of vessels are created.

A pure projection image would fail to visualize vessel 11 due to all of the intervening anatomical structures. For example, static intervening structure, such as organ 12, would obscure the vessel. In x-ray studies the vessels are isolated by injecting a contrast material. In this invention, using NMR imaging, an isolated projection image is made of vessel 11 by making use of the flowing motion of blood through the vessel. Processor 15 is used to create a projection image of volume 10 of solely moving material. Thus display 16 provides an angiographic image of vessel 11.

U.S. Pat. No. 4,523,596 is the basic patent on projection angiography using magnetic resonance. In one embodiment of this patent a method of cancellation excitation is disclosed whereby an excitation is used which excites only moving material, cancelling the signals from static material. In this invention we present improved methods of cancellation excitation. These methods have an immunity to the uniformity of excitation so that, if the excitation amplitudes are somewhat different at different portions of the volume, the net effect will be negligible. Also, during an excitation, static material is returned to equilibrium. This has the great advantage of allowing the material to be immediately re-excited, without waiting for the excited moments to relax. For example, if it is desired to perform additional excitations for improved SNR, they can be done immediately without waiting for a time comparable to $T_1$.

Referring to FIG. 1, a conventional NMR imaging system is shown having a main field $B_0$ in the z direction, usually 0.1 to 2 Telsa. The system has a set of controllable gradient fields $G_x$, $G_y$ and $G_z$, each providing fields in the z direction which vary linearly with x,y and z respectively. These are supplied with appropriate coils which are omitted for simplicity but are illustrated in detail in many of the previously listed references such as the book *Nuclear Magnetic Resonance Imaging in Medicine*. Radio frequency coils 13 and 14 are connected together to provide a relatively uniform r.f. field. Although separate coil pairs can be used for the transmit and receive functions, in this illustration a single coil pair is shown. Switch 18 is used to change from the transmit to receive modes. In the excitation mode, with the switch as shown, excitation signal $H_1$ excites the volume. Following excitation, the switch is thrown to the receive position to receive signal 19 and apply it to processor 15. In this processor a projection image of the volume is created and applied to display 16 to provide projection vessel image 17, with all static material removed.

Figure 2:
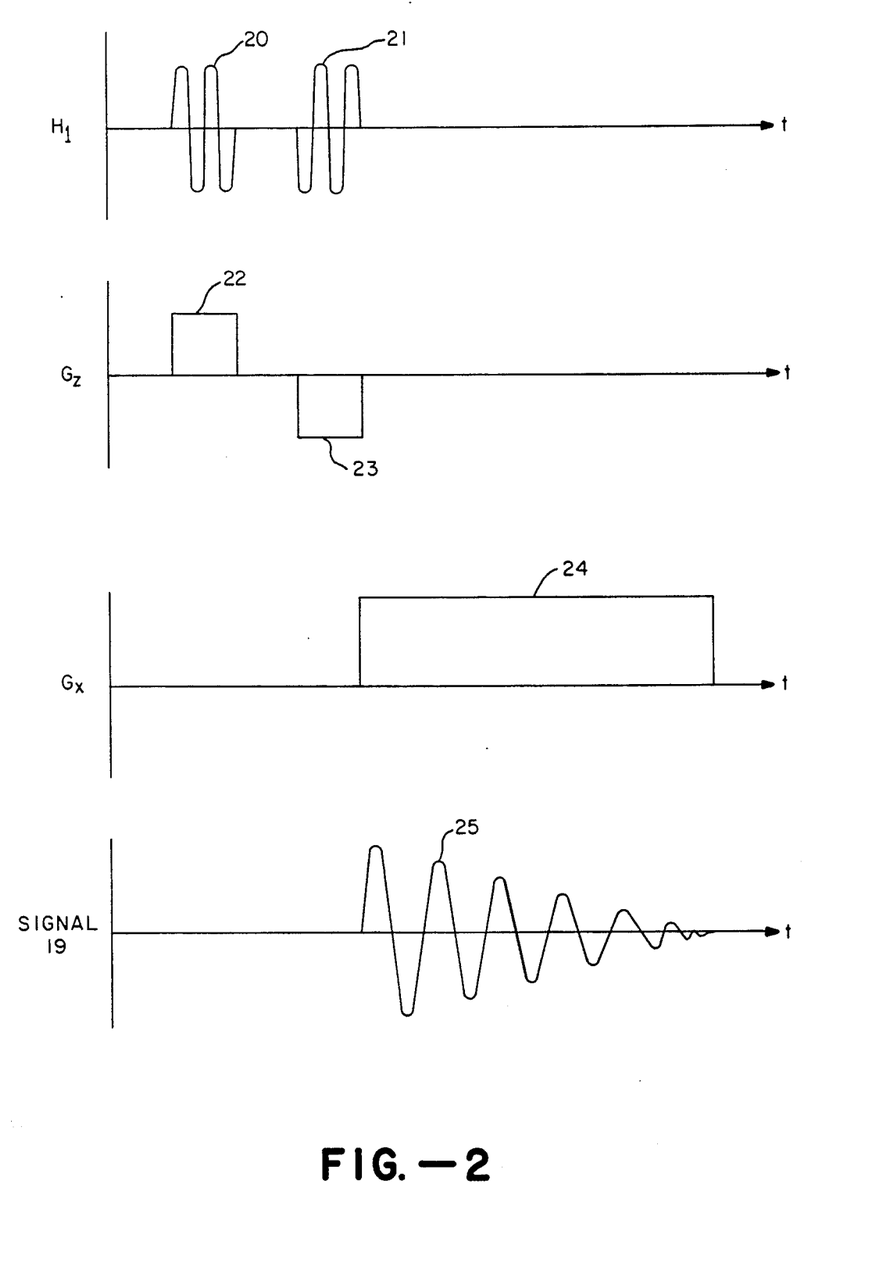
FIG. 2 is a set of waveforms illustrating an embodiment of the invention.

A preferred embodiment of the invention is shown in FIG. 2. Instead of the usual excitation, the $H_1$ excitation signal is a sequence of two bursts providing tip angles of $+90°$ and then $-90°$, or vice versa. In this way, the net magnetic moment is returned to equilibrium. To excite a desired planar section gradient $G_z$ is used with positive portion 22 and negative portion 23. If the frequency $\omega_0$ of bursts 20 and 21 are each equal to $\gamma B_0$, the $z=0$ plane, corresponding to the null plane of the $G_z$ gradient coils, will be excited. This excitation, as previously indicated, will be returned to equilibrium for static material. Moving material however, such as the blood flowing in vessels, will not receive the complete excitation sequence and thus not be returned to equilibrium and generate FID signal 25.

Figure 5:
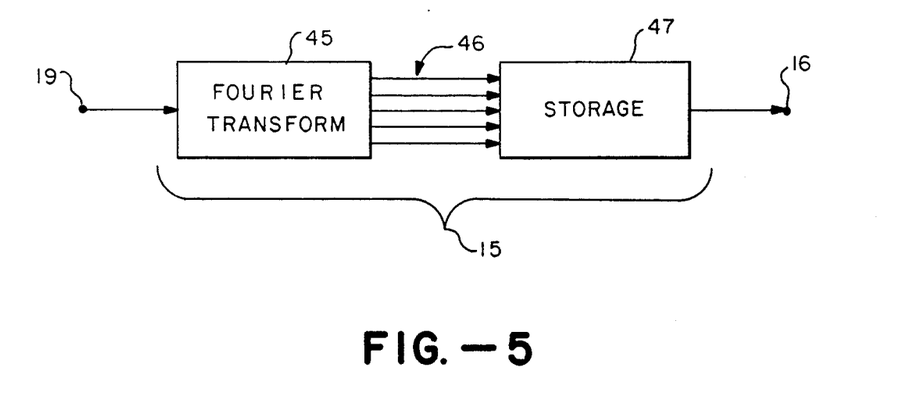
FIG. 5 is a schematic diagram of an embodiment of a signal processor used in the invention.

Thus signal 25 is present due to moving blood only. Processor 15 is used to process this signal to create a two-dimensional projection image of volume 10 containing vessel 11 resulting in vessel image 17. One approach to generating the projection image is shown in FIG. 5. Signal 19, consisting of FID 25, is Fourier transformed in 45. As a result of $G_x$ gradient 24, each line in the z=0 plane parallel to the y axis produces a different frequency. Thus each frequency output 46 from Fourier transform 45 represents a different projection line. Each of these are stored in 47 to provide a line in the 2-D projection image.

The entire sequence of FIG. 2 is repeated to provide different lines at different z planes to complete the projection image. Each of these are stored in 47, after which the entire projection image is passed to display 16. Different z planes can be excited in two general ways. Firstly, $B_0$ can be incremented for each plane an amount $\Delta B$. If we continue to excite with the same frequency, $\omega_0 = \gamma B_0$, where $\gamma$ is the gyromagnetic ratio, we will excite an adjacent plane displaced by $\Delta z$ given by $$\Delta z = \frac{1}{G_z}\left[\frac{\omega_0}{\gamma} - B_0 - \Delta B\right] = -\frac{\Delta B}{G_z}$$

Thus, by adding a set of coils to increment the main field, we can excite an array of planes and produce a 2D projection image.

Incrementing the main field may prove difficult in superconducting magnets. In that case we can excite adjacent planes by varying the frequencies of bursts 20 and 21. If one burst, such as 20, is incremented an amount $\Delta\omega$ the second burst must be reduced in frequency by the same $\Delta\omega$ to excite the same plane. The displacement $\Delta z$ in the excited plane is given by $$\Delta z = \frac{\Delta\omega}{\gamma G_z}$$

In both of these methods a sequence of about 100–500 planes are excited and processed has shown to provide the projection image.

The system of FIG. 2 has a significant immunity to non-uniform excitation. As shown the tip angles for bursts 20 and 21 are nominally 90° and −90°, returning the magnetic moment to equilibrium. If, due to non-uniform excitation, the resultant tip angles in some region are greater than or less than 90°, the net result will be essentially unaffected since both tip angles are effected equally. Thus static material will continue to be returned to equilibrium and not be excited, and the resultant vessel signal will experience a negligible amplitude change.

Although excitation bursts are shown in FIG. 2, a variety of excitation can be used which are the inverse of each other. Basically the magnetic moment is excited to some state, and then returned, via the same path, to the equilibrium state. Thus, if the first excitation is some general $H_1(t)$, the second excitation is simply $-H_1(-t)$, returning the magnetic moment to equilibrium. Also, the bursts needn't be perfectly symmetrical as long as their integrals accomplish the inverse operation. Thus, for example, the first 90° burst 20 can have a certain amplitude and duration, while the second 90° burst 21 can have twice the amplitude and half the duration. The duration of the bursts and the time between them can be adjusted so as to maximize the resultant signal for blood flow at the expected velocity in the vessel being studied.

Figure 3:
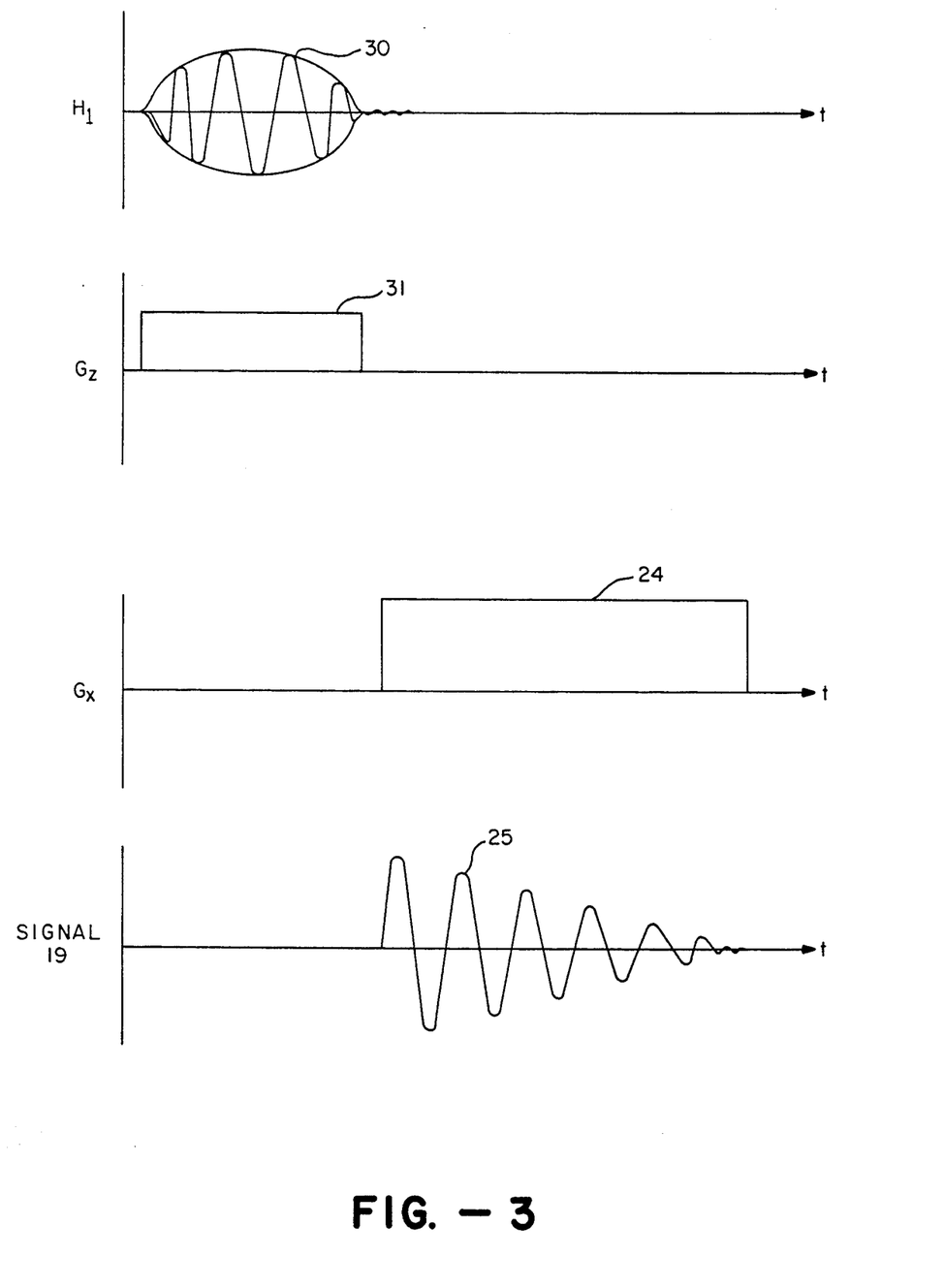
FIG. 3 is a set of waveforms illustrating on alternate embodiment of the invention.

An alternate cancelling excitation approach is illustrated in FIG. 3. Here, the magnetic moment of static material is excited and returned to equilibrium by using a tip angle of $2\pi$ radians. The magnetic moment undergoes a complete rotation. $G_z$ gradient 31 serves to select the desired planar section. The envelope 30 of the $H_1$ excitation is shaped so as to approximate a hyperbolic secant waveform. As is described in the publication "A Highly Selective 180° Pulse" by D. I. Hoult, M. S. Silver and R. I. Joseph in the *Proceedings of the Society of Magnetic Resonance in Medicine*, pp. 342-3, Aug. 1984 this type of excitation makes the system relatively insensitive to amplitude variations in the excitation.

As with the previous system, moving materials such as blood are not fully returned to equilibrium since they receive only a portion of the total excitation. As a result, moving material produces FID Signal 25 which, with readout gradient 24, as previously described in conjunction with FIG. 5, forms a line in the final projection image of vessel 17. Refocusing $G_z$ gradient 31 can provide an increased signal of moving material by minimizing the phase shifts in the z direction. To complete the projection image by exciting all of the required z planes, different frequencies are used for $H_1$.

In both the embodiments of FIG. 2 and FIG. 3, since the magnetic moment is returned to equilibrium, the excited section can be immediately re-excited for improved SNR. The static material will again be returned to equilibrium and the new blood flowing into the section will be excited and produce a signal.

The systems shown in FIGS. 2, 3 and 5 can be used for a wide class of vessel imaging. In those cases where the vessels undergo significant cardiac motion, as with the coronary arteries, the repetitive sequences can be timed with the heart rate using an ECG signal. Thus the vessels will be essentially in the same position with the excitation of each planar section representing successive lines in the projection image. In many cases, however, such as patients with erratic cardiac rhythms, ECG gating cannot be relied on.

Figure 4:
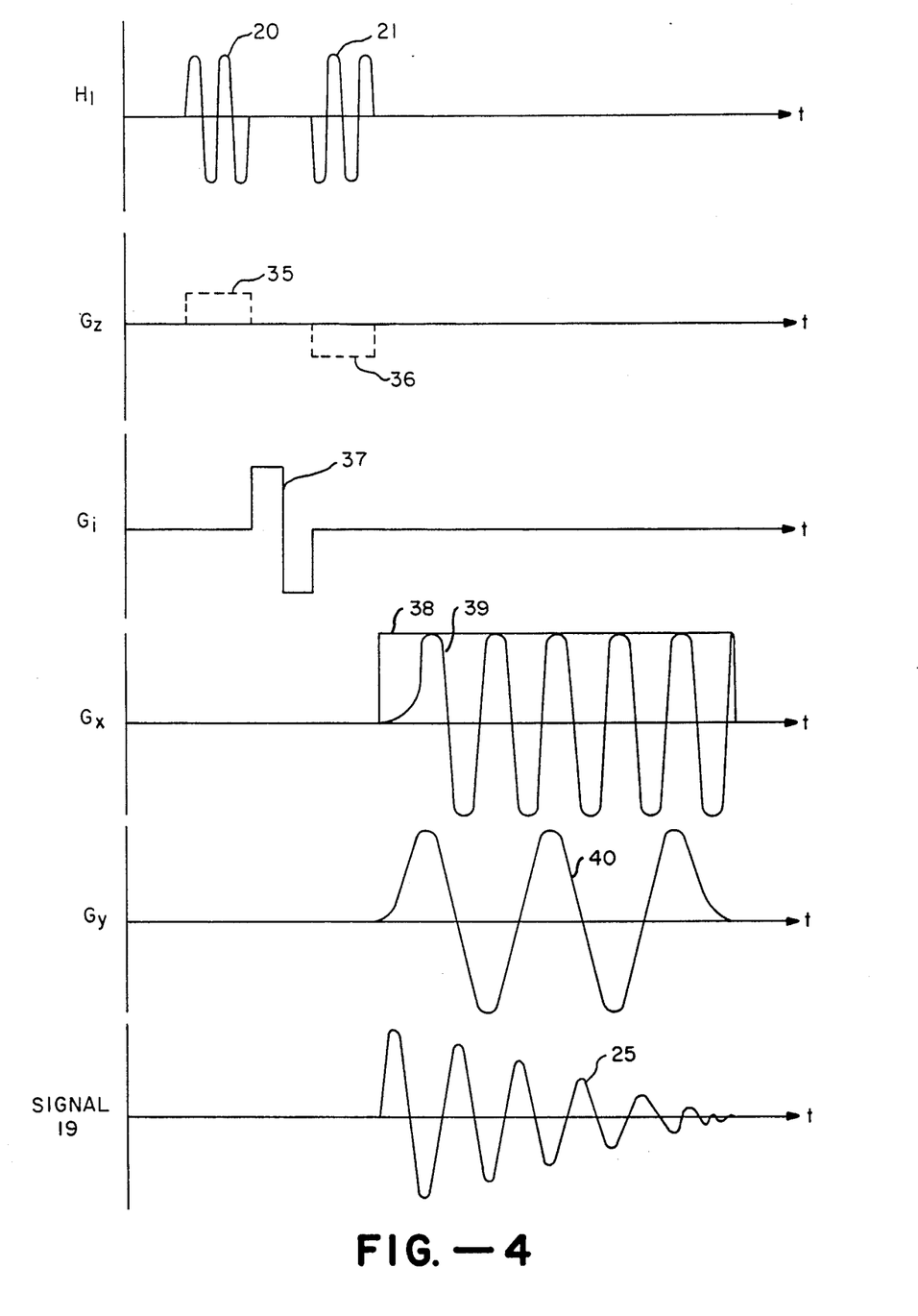
FIG. 4 is a set of waveforms illustrating an embodiment of the invention where the entire volume is excited.

The system of FIG. 4 is a more general approach to the cancellation excitation. Here the entire volume of interest can be excited and a projection image made of the moving material in the entire volume. As before, the magnetic moment is returned to equilibrium so that static material produces no signal. Since the entire volume has been excited, a projection image can be reconstructed during a single FID signal 25. This completely avoids any motion considerations.

The excitation $H_1$ again consists of a +90° flip angle burst 20 and a −90° flip angle burst 21 to return the system to equilibrium. No $G_z$ gradient is necessary during the bursts since the entire volume of interest 10 is being excited. However, in some circumstances it may be desired to limit the excited volume to the regions where the magnetic field is relatively uniform. In those cases small $G_z$ gradient pulses 35 and 36 can be used to limit the volume excited. The frequencies of bursts 20 and 21 will be equal.

The basic velocity encoding is accomplished with gradient $G_i$ using symmetrical signal 37. The $G_i$ label refers to a general gradient which is chosen to be in the general direction of the blood flow to be imaged. Thus, if the vessels are generally in the x direction, or have a significant x component, $G_i$ will equal $G_x$. $G_i$ can be at angles to the principal axes. The velocity encoding results from a phase advance or retard that takes place during gradient 37 so that moving material is not restored to equilibrium. The relative phase shift $\theta$ for material moving with a velocity v in the presence of gradient G is given by $$\theta = \int_0^T G \cdot vt\,dt - \gamma \int_0^T G \cdot (vT + vt)dt$$
$$= -\gamma G \cdot vT^2$$

where T is the duration of each half of waveform 37. Thus the phase shift is proportional to velocity and the cosine of the angle between the gradient and the motion. Again, static motion produces no phase shift and is returned to equilibrium without producing a signal.

Thus, with the excitation sequence shown, we have excited the moving blood in the vessels in the volume as long as it has a component in the direction of gradient $G_i$. We now provide a two-dimensional image of the excited moving material. In FIG. 4 we assume that we wish to make a projection image in the z direction, so that we use different gradient waveforms for $G_x$ and $G_y$ to provide an array of line integrals in the z direction. We can project in any direction by using a different set of spatially orthogonal gradients. The gradient waveforms can be sinusoids of different frequencies, such as $G_x$ gradient 39 and $G_y$ gradient 40. Alternatively, one gradient can be a constant, such as $G_x$ gradient 38, with the other a sinusoid. In general the phase modulation resulting from each gradient should be orthogonal in each gradient waveform.

Figure 6:
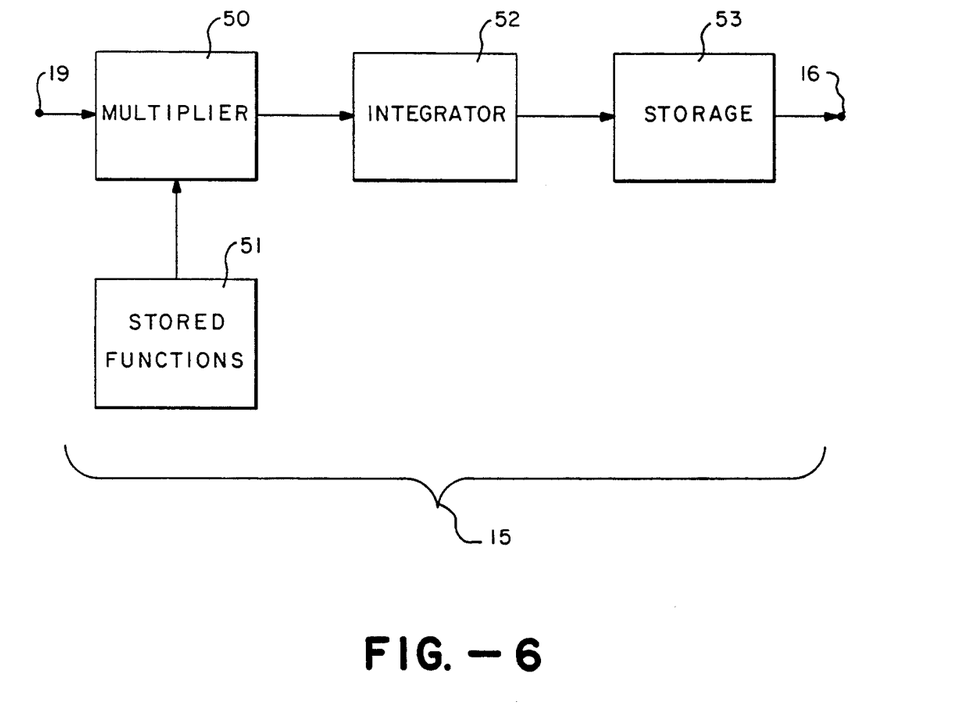
FIG. 6 is a schematic diagram of an alternate embodiment of a signal processor.

Referring to FIG. 6, the resultant signal 19, FID 25, is demodulated to produce a 2D projection image 16. This method of demodulation is described in the article "Volumetric NMR Imaging Using Time-Varying Gradients" by A. Macovski, published in *Journal of Magnetic Resonance in Medicine*, 2:29–40, 1985 and in pending patent application Ser. No. 499,218 entitled "Simultaneous NMR Imaging System", abandoned in favor of application Ser. No. 603,333, now U.S. Pat. No. 4,639,671. Received signal 19, FID 25, is given by $$v(t) = \int m(r)e^{-t/T_2}\exp{-i\gamma[xD_x(t)+yD_y(t)]}dr$$

where $D_x(t)$ and $D_y(t)$ are the integrals of gradient signals $G_x(t)$ and $G_y(t)$. An ideal projection $p(x,y)$ in the z direction can be structured as $$p(x,y) = \int m(x,y,z)dz$$

This image has infinite resolution. Our actual projection image $p(x_0,y_0)$ is derived by multiplying the signal $v(t)$ by a kernel based on the gradient functions and integrating as given by $$p(x_0,y_0) = \int v(t)\exp{i\gamma[x_0D_x(t)+y_0D_y(t)]}dt$$

This is shown in FIG. 6 where FID signal 19 is multiplied in multiplier 50 by a stored signal from the stored functions 51. Signal 19 can be operated on directly or can first be demodulated using the standard quadrature demodulators. If it is first demodulated, the stored functions are of the form $\exp{i\gamma[x_0D_x(t)+y_0D_y(t)]}$ for each projection imaging point $x_0,y_0$. If signal 19 remains in its original carrier form, it is multiplied by $\exp{i\omega_0 t}\exp{i\gamma[x_0D_x(t)+y_0D_y(t)]}$ which is a phase modulated carrier signal. Following multiplication in multiplier 50 the signal is integrated in integrator 52 to form each projection imaging point. This operation would normally be accomplished in a digital computer. The calculated projection value of each $x_0,y_0$ point is stored in storage structure 53 where it is then displayed in display 16. A variety of other processing methods are described in the previous references. These include multiplying v(t) by harmonics of the gradient signal to improve the impulse response.

The method as described in FIGS. 4 and 6 can create a projection image of moving material in a single excitation. However, for improved SNR, it may be desired to repeat the entire sequence a few times and average the resultant images. In cases where cardiac structures are being imaged, the repeated sequences can be timed with the ECG signal. The repeated sequences can be identical, or can be varied somewhat to improve the impulse response. For example if, on each successive sequence, the starting phase of gradient signals 39 and/or 40 are changed, then the spatial frequency spectrum will be more fully filled, resulting in an impulse response with smaller side lobes. Alternatively different waveforms can be used for $G_x$ and $G_y$ on successive excitation sequences to achieve the same result. In this way, a reasonable projection image of the vessels in a volume can be made with a single excitation, while improved SNR and improved resolution can be obtained by combining multiple excitations.

In the method previously described a given gradient signal $G_i$, 37, is used to encode moving material. If desired, the entire operation can be repeated with gradient $G_i$ switched to an orthogonal direction. For example, if the vessel lies in an xy plane, $G_i$ can equal $G_x$ for one measurement set, and $G_y$ for another. In this way the magnitude and direction of the blood flow can be evaluated by calculating the magnitude and angle at each point in the image where $$|v| = \sqrt{v_x^2 + v_y^2}$$

$$\text{and } \theta_v = \tan^{-1}\frac{v_y}{v_x}.$$

Although the systems of FIGS. 2 and 3 show decoding of the single projection line using static gradient 24, these can also be used with other waveforms for $G_x$ such as a sinusoid. In that case the demodulation would take place as shown in FIG. 6 except that the multiplying waveforms derived from the stored functions 51 would contain a single dimension only, such as $D_x(t)$.

In each of the embodiments the image was derived from an FID signal 25. This was done primarily to deal with effects of turbulent flow which exists in some blood vessels. With turbulence the individual magnetic moments can lose coherence after a relatively short time following excitation. For this reason the information is derived as soon as possible. In many cases, however, turbulence is not a severe problem. In those cases spin echo signals can be generated in the standard manner using 180° tip angle bursts or reversed gradients. These spin echoes are easier to deal with since they don't require rapid rise times of the gradients and they have longer duration than the FID. Where spin echoes are used, the excitation process is the same as shown and the receiving process the same as shown during the spin echo. What is required is the additional 180° excitation or gradient reversal to provide the spin echo signal.

In some cases it may be desirable to combine the isolated vessel image with a projection image of the anatomy. For example, the vessels can be displayed as a color overlay on a black and white anatomical image. To accomplish this we make another image where only the excitation interval is changed, with the readout the same as shown. For example, in FIG. 2 we use solely burst 20, eliminating burst 21, thus exciting static material. In FIG. 3 burst 30 is reduced to provide a 90° rather than $2\pi$ radian flip angle. In FIG. 4 we again use a single burst and eliminate gradient $G_i$. These will each image the static structures, providing a projection anatomical image which can be mixed with the vessel image.

What is claimed is:

1. A method of imaging moving material in a volume using magnetic resonance comprising the steps of:

substantially spatially uniformly exciting the magnetic moments in the volume during an excitation period so that static material will produce no net received signals following the excitation and static material magnetic moments will be returned to their equilibrium position whereby only moving material in said volume will produce net received signals, applying a static magnetic gradient waveform to said volume in said excitation period, and processing received signals to form a two-dimensional projection image of the moving material in the volume.

2. The method as described in claim 1 wherein the step of exciting the magnetic moments in the volume includes the step of exciting the moments with a first excitation and then exciting the moments with a second excitation which is the inverse of the first excitation causing the moments of static material to return to equilibrium.

3. Apparatus for use in imaging moving material in a volume using magnetic resonance comprising:

means for substantially spatially uniformly exciting magnetic moments in a volume during an excitation period such that static material will produce no net received signals following the excitation and static material magnetic moments will be returned to their equilibrium position whereby only moving material will produce net received signals, means for applying a static magnetic gradient waveform to said volume in said excitation period, and means for processing the received signals to form a two-dimensional projection image of the moving material in the volume.

4. Apparatus as described in claim 3 where the means for exciting the volume includes means for providing a first excitation and means for providing a second excitation, following the first excitation, which is the inverse of the first excitation.

5. Apparatus as described in claim 4 where said means for providing a first excitation comprises means for providing a first excitation which provides a burst producing a flip angle of substantially 90° with respect to a reference phase and said means for providing a second excitation comprises means for providing a second excitation which provides a burst producing a flip angle of substantially $-90°$ with respect to the same reference phase.

6. Apparatus as described in claim 3 where the means for applying a magnetic gradient waveform comprises means for providing a magnetic gradient waveform having a positive and a negative portion.

7. Apparatus as described in claim 6 where said means for providing a magnetic gradient waveform comprises means for providing a magnetic gradient waveform, where one polarity of the magnetic gradient waveform coincides with a first excitation burst and the other polarity of the magnetic gradient waveform corresponds to a second excitation burst whereby a selective region of the volume is excited.

8. Apparatus as described in claim 7 where said means for substantially spatially uniformly exciting magnetic moments includes means for providing a first excitation with a flip angle of substantially 90° and for providing a second excitation following the first excitation with a flip angle of substantially $-90°$.

9. Apparatus as described in claim 3 where the means for applying a magnetic gradient waveform comprises means for providing a magnetic gradient waveform having a zero average value.

10. Apparatus as described in claim 3 including means for providing a sequence of excitations with a gradient used during each excitation to selectively excite a sequence of planar sections and where the processing means includes means for measuring the projection of each planar section.

11. Apparatus as described in claim 10 where the means for measuring each projection includes means for applying a static gradient normal to the projection direction and Fourier transforming the received signal.

* * * * *